(12) United States Patent
Ahn et al.

(10) Patent No.: US 10,964,871 B2
(45) Date of Patent: Mar. 30, 2021

(54) MICRO LED STRUCTURE AND METHOD OF MANUFACTURING SAME

(71) Applicant: POINT ENGINEERING CO., LTD., Asan (KR)

(72) Inventors: Bum Mo Ahn, Suwon (KR); Seung Ho Park, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/904,102

(22) Filed: Jun. 17, 2020

(65) Prior Publication Data
US 2020/0335680 A1    Oct. 22, 2020

Related U.S. Application Data

(63) Continuation of application No. 16/235,706, filed on Dec. 28, 2018, now Pat. No. 10,707,394.

(30) Foreign Application Priority Data

Jan. 5, 2018    (KR) .......................... 10-2018-0001531

(51) Int. Cl.
*H01L 33/62*    (2010.01)
*H01L 25/075*    (2006.01)
*H01L 27/12*    (2006.01)
*H01L 23/00*    (2006.01)

(52) U.S. Cl.
CPC .............. *H01L 33/62* (2013.01); *H01L 24/32* (2013.01); *H01L 24/83* (2013.01); *H01L 25/0753* (2013.01); *H01L 27/1214* (2013.01); *H01L 2224/32227* (2013.01); *H01L 2224/83851* (2013.01); *H01L 2933/0066* (2013.01)

(58) Field of Classification Search
CPC ... H01L 25/0753; H01L 33/62; H01L 25/167; H01L 2933/0066
USPC ..................................................... 438/28, 15
See application file for complete search history.

(56) References Cited

U.S. PATENT DOCUMENTS

| | | |
|---|---|---|
| 9,698,134 B2 | 7/2017 | Li et al. |
| 2006/0066766 A1* | 3/2006 | Tanaka ................ G02F 1/13394 349/44 |
| 2011/0254029 A1 | 10/2011 | Lai |

(Continued)

FOREIGN PATENT DOCUMENTS

| | | |
|---|---|---|
| KR | 10-0731673 B1 | 6/2007 |
| KR | 10-2014-0025055 A | 3/2014 |

*Primary Examiner* — Jonathan Han

(57) ABSTRACT

The present invention relates to a micro LED structure and a method of manufacturing the same. More particularly, the present invention relates to a micro LED structure and a method of manufacturing the same, the micro LED structure including: a micro LED; a circuit board driving the micro LED; and an anisotropic conductive anodic oxide film provided between the micro LED and the circuit board to electrically connect the circuit board and the micro LED. According to the present invention, without applying an external force (thermocompression bonding) to the anisotropic conductive anodic oxide film, it is possible to electrically connect the circuit board and the micro LED. In addition, it is possible to obtain characteristics such as uniform conductivity in a vertical direction and heat dissipation.

2 Claims, 7 Drawing Sheets

(56) References Cited

U.S. PATENT DOCUMENTS

| | | | |
|---|---|---|---|
| 2014/0085829 A1* | 3/2014 | Yamashita | H05K 1/0204 |
| | | | 361/717 |
| 2016/0336262 A1* | 11/2016 | Yamashita | H05K 1/115 |
| 2017/0154919 A1* | 6/2017 | Chen | H01L 21/6835 |
| 2017/0338374 A1* | 11/2017 | Zou | H01L 33/44 |
| 2017/0365588 A1* | 12/2017 | Chen | H01L 33/62 |

* cited by examiner

FIG. 7A
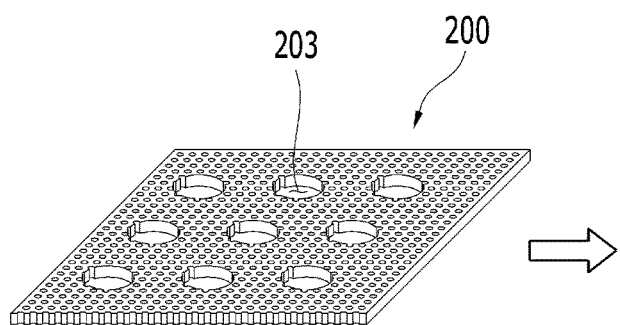
FIG. 7B
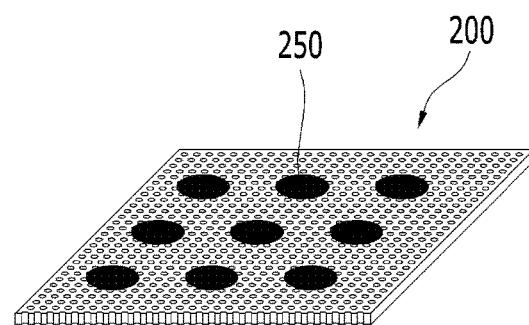
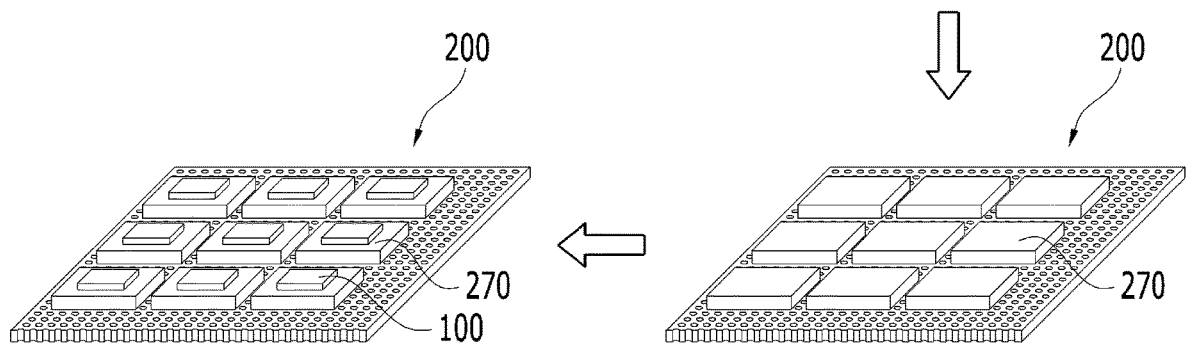
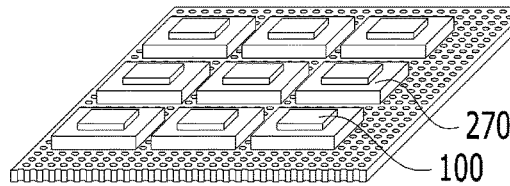
FIG. 7D
FIG. 7C

MICRO LED STRUCTURE AND METHOD OF MANUFACTURING SAME

CROSS REFERENCE TO RELATED APPLICATION

The present application is a continuation application of U.S. patent application Ser. No. 16/235,706, filed Dec. 28, 2018, which claims priority to Korean Patent Application No. 10-2018-0001531, filed Jan. 5, 2018, the entire contents of which are incorporated herein for all purposes by this reference.

BACKGROUND OF THE INVENTION

Field of the Invention

The present invention relates to a micro LED structure and a method of manufacturing the same. More particularly, the present invention relates to a micro LED structure and a method of manufacturing the same, the micro LED structure having an anisotropic conductive anodic oxide film using an anodic oxide film.

Description of the Related Art

Currently, the display market is still dominated by LCDs, but OLEDs are quickly replacing LCDs and emerging as mainstream products. In a current situation where display makers are rushing to participate in the OLED market, micro LED displays have emerged as another next generation display. Liquid crystal and organic materials are the core materials of LCDs and OLEDs, respectively, whereas the micro LED display uses 5 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673) disclosed by Cree Inc., related research papers based thereon were subsequently published.

A micro LED structure is disclosed in Korean Patent Application Publication No. 10-2014-0025055 (hereinafter referred to as 'related art'). A process for manufacturing a micro LED structure disclosed in the related art will be described. An anisotropic conductive film is applied on a first substrate on which multiple first electrodes are disposed to form an anisotropic conductive film layer. Here, the anisotropic conductive film (ACF) is formed of multiple particles in which conductive cores are respectively coated with an insulating film. When pressure or heat is applied to the ACF, the insulating film is destroyed at regions to which the pressure or heat is applied, such that the regions of the ACF are electrically connected to a layer via exposed cores of the ACF. Then, a second substrate provided with multiple semiconductor light emitting devices, which corresponds to positions of first electrodes and constitute individual pixels, is disposed such that the first electrodes respectively face the semiconductor light emitting devices. Thereafter, the first substrate and the second substrate are thermally pressed. Accordingly, the first substrate and the second substrate are bonded to each other. Accordingly, the first electrodes and the semiconductor light emitting devices are respectively electrically connected to each other since only contact regions of the ACF between the first electrodes and the semiconductor light emitting devices become conductive by the thermocompression bonding. Then, the second substrate is removed. The second electrodes are formed between the semiconductor light emitting devices exposed by removal of the second substrate. Then, if necessary, a transparent insulating layer is formed by coating silicon oxide ($SiO_x$) or the like on the substrate provided with the semiconductor light emitting devices and the second electrodes such that a micro LED structure is obtained.

In the related art, the anisotropic conductive film layer is placed in a state where the first electrodes are positioned on the substrate, and the semiconductor light emitting devices are connected by heat or pressure such that only contact regions of the ACF between the first electrodes and the semiconductor light emitting devices become the conductive ACF and the remaining portion of the ACF is not conductive. Therefore, not only the semiconductor light emitting devices and the first electrodes can be bonded to each other, but also the electrical connection can be achieved.

Other inventions utilizing the characteristics of the ACF include those disclosed in U.S. Patent Application Publication No. 2011-0254029, U.S. Pat. No. 9,698,134, and so on.

However, the technique using an ACF for manufacturing a micro LED structure requires an additional equipment and process for thermocompression bonding. In addition, there is a difference in thermocompression for each micro LED according to a geometry of the object to be pressed or physical pressing force whereby there is a possibility that a difference may occur in electrical connection to each micro LED.

In addition, the related art has a problem in that a distance between the micro LEDs is required to be designed to prevent a part of the core in which the insulating film is broken from affecting adjacent micro LEDs. Furthermore, a geometrical step occurs at the boundary between the thermocompression-bonded portion and the non-thermocompression-bonded portion, and such a step portion is required to be designed such that the ACF does not affect the luminous efficacy of the micro LED.

DOCUMENTS OF RELATED ART (Patent Document 1) Korean Patent No. 0731673;
(Patent Document 2) Korean Patent Application Publication No. 2014-0025055;
(Patent Document 3) U.S. Patent Application Publication No. 2011-0254029; and
(Patent Document 4) U.S. Pat. No. 9,698,134

SUMMARY OF THE INVENTION

Accordingly, the present invention has been made keeping in mind the above problems occurring in the related art, and the present invention is intended to propose a micro LED structure and a method of manufacturing the same in which a micro LED is electrically connected to a circuit board by an anisotropic conductive anodic oxide film filled with a conductive material.

In order to achieve the above objective of the present invention, there is provided a micro LED structure including: a micro LED; a circuit board driving the micro LED; and an anisotropic conductive anodic oxide film provided between the micro LED and the circuit board to electrically connect the circuit board and the micro LED, wherein the anisotropic conductive anodic oxide film in which pores formed by anodizing a metal are filled with a conductive material electrically connects the circuit board and the micro LED.

In addition, the anisotropic conductive anodic oxide film may be structured such that all the pores in an anodic oxide film are filled with the conductive material.

Of the pores in an anodic oxide film, the anisotropic conductive anodic oxide film may be structured such that pores in a region corresponding to a region where the micro LED is provided are filled with the conductive material.

In order to achieve the above objective of the present invention, there is provided a micro LED structure including: a micro LED; a circuit board driving the micro LED; and an anisotropic conductive anodic oxide film provided between the micro LED and the circuit board to electrically connect the circuit board and the micro LED, wherein the anisotropic conductive anodic oxide film is configured with a through-hole having a hole size larger than that of pores formed by anodizing a metal, and the through-hole is filled with a conductive material to electrically connect the circuit board and the micro LED.

In order to achieve the above objective of the present invention, there is provided a method of manufacturing a micro LED structure, the method including: preparing an anisotropic conductive anodic oxide film by filling a conductive material in pores of an anodic oxide film formed by anodizing a metal; forming a metal pad on the anisotropic conductive anodic oxide film; and mounting a micro LED on the metal pad.

In addition, the method may further include: providing a circuit board driving the micro LED at a position under the anisotropic conductive anodic oxide film.

In order to achieve the above objective of the present invention, there is provided a method of manufacturing a micro LED structure, the method including: preparing an anisotropic conductive anodic oxide film by filling a conductive material in a through-hole of an anodic oxide film formed by anodizing a metal; forming a metal pad on the anisotropic conductive anodic oxide film; and mounting a micro LED on the metal pad.

In addition, the method may further include: providing a circuit board driving the micro LED at a position under the anisotropic conductive anodic oxide film.

As described above, according to a micro LED structure and a method of manufacturing the same of the present invention, a configuration of an anisotropic conductive anodic oxide film using an anodic oxide film is provided. Therefore, without applying an external force (thermocompression bonding) to the anisotropic conductive anodic oxide film, it is possible to electrically connect a circuit board and a micro LED.

In addition, a micro LED structure and a method of manufacturing the same of the present invention apply an anisotropic conductive anodic oxide film such that it is possible to obtain characteristics such as uniform conductivity in a vertical direction and heat dissipation.

BRIEF DESCRIPTION OF THE DRAWINGS

The above and other objects, features and other advantages of the present invention will be more clearly understood from the following detailed description when taken in conjunction with the accompanying drawings, in which:

FIGS. 7A to 7D are views illustrating a method of manufacturing the micro LED structure according to the third embodiment of the present invention.

DETAILED DESCRIPTION OF THE INVENTION

Figure 1:
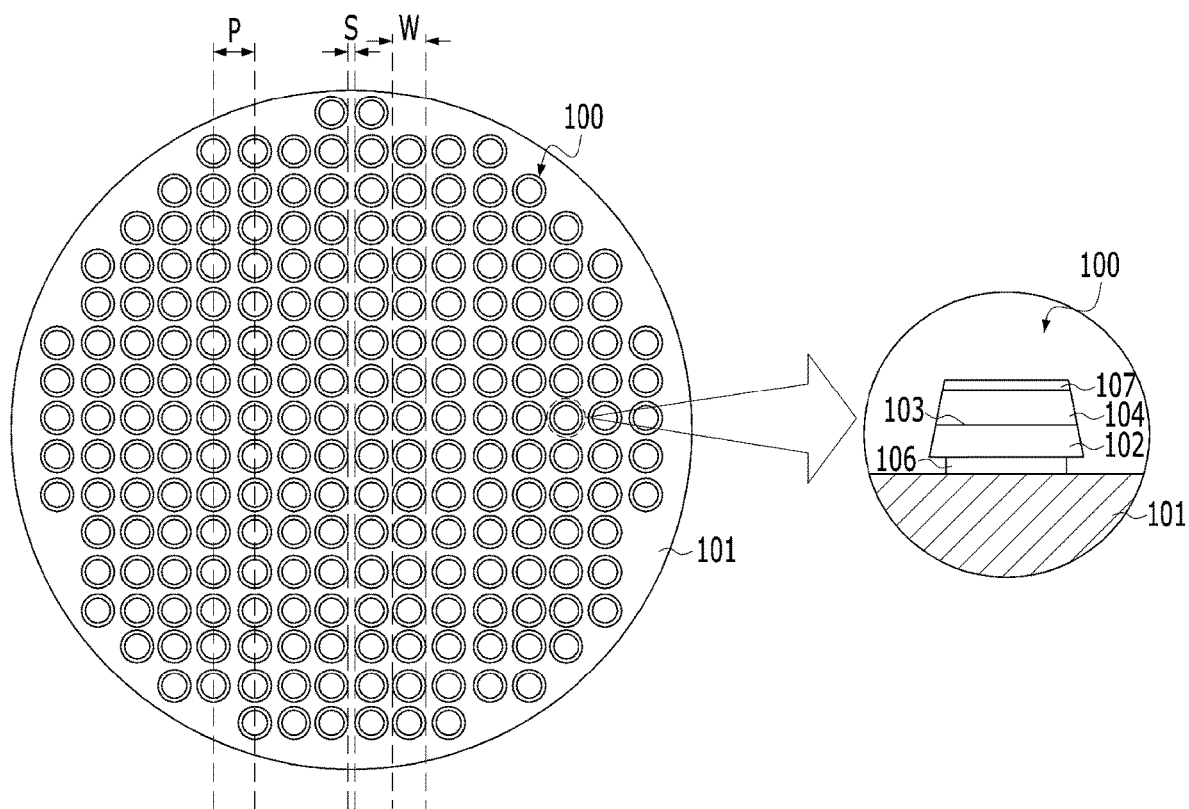
FIG. 1 is a view illustrating a micro LED that is an object of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specially listed exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinbelow, embodiments of the present invention will be described in detail with reference to the accompanying drawings.

FIG. 1 is a view illustrating a micro LED 100 mounted on a micro LED structure according to an embodiment of the present invention. The micro LED 100 is fabricated and disposed on a growth substrate 101.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm.

The growth substrate 101 may be a conductive substrate or an insulating substrate. For example, the growth substrate 101 is formed of at least one selected from among the group consisting of sapphire ($Al_2O_3$), SiC, Si, GaAs, GaN, ZnO, Si, GaP, InP, Ge, and $Ga_2O_3$.

The micro LED 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may include an n-type semiconductor layer, and the second semiconductor layer 104 may include a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$), and may have a single Quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be formed of various conductive materials including a metal, conductive oxide, and conductive polymer.

Multiple micro LEDs 100 formed on the growth substrate 101 are cut along a cutting line by using a laser or the like, and then separated from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LEDs 100.

First Embodiment

Figure 2:
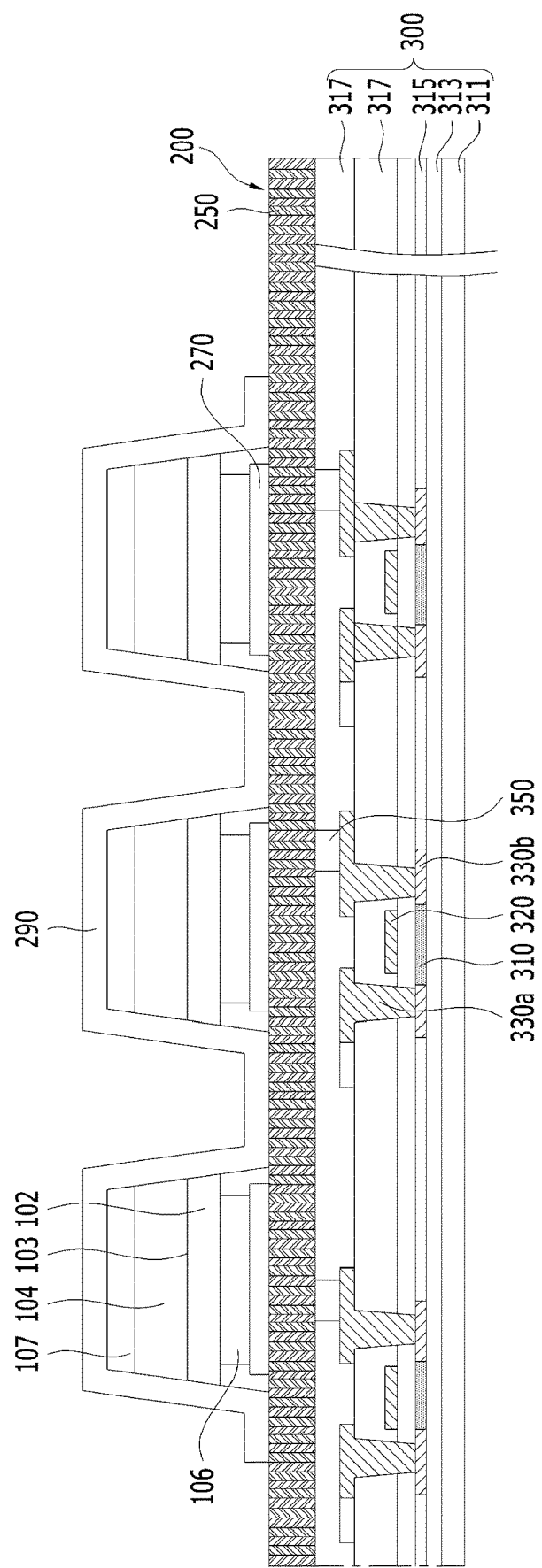
FIG. 2 is a cross-sectional view illustrating a micro LED structure according to a first embodiment of the present invention.

FIG. 2 is a view illustrating a micro LED structure according to a first embodiment of the present invention.

Hereinafter, a circuit board 300 on which the micro LEDs 100 illustrated in FIG. 1 are mounted will be described.

The circuit board 300 driving the micro LEDs 100 includes various materials. For example, the circuit board 300 may be made of a transparent glass material having $SiO_2$ as a main component. However, components of the circuit board 300 are not limited to this, and the circuit board 300 may be made of a transparent plastic material and thus have solubility. The plastic material may be an insulating organic substance selected from the group consisting of polyethersulfone (PES), polyacrylates (PARs), polyetherimide (PEI), polyethylene napthalate (PEN), polyethylene terephthalate (PET), polyphenylene sulfide (PPS), polyarylate, polyimide, polycarbonate (PC), cellulose triacetate (TAC), and cellulose acetate propionate (CAP).

In the case of a bottom emission type in which an image is implemented in a direction of the circuit board 300, the circuit board 300 is required to be formed of a transparent material. However, in the case of the top emission type in which an image is implemented in a direction opposite to the circuit board 300, the circuit board 300 is not required to be formed of a transparent material. In this case, the circuit board 300 may be formed of metal.

In the case of forming the circuit board 300 from metal, the circuit board 300 may be formed of at least one metal selected from among the group consisting of iron, chromium, manganese, nickel, titanium, molybdenum, stainless steel (SUS), Invar, Inconel, and Kovar, but is not limited thereto.

The circuit board 300 may include a buffer layer 311. The buffer layer 311 provides a flat surface and blocks foreign matter or moisture from penetrating therethrough. For example, the buffer layer 311 may be formed of an inorganic substance such as silicon oxides, silicon nitride, silicon oxynitride, aluminum oxide, aluminum nitride, titanium oxides, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material and so on.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate insulating layer 313 serves to isolate the active layer 310 and the gate electrode 320. The gate dielectric layer 313 may be formed of a multilayer or a single layer of a film made of an inorganic substance such as silicon oxides and/or silicon nitrides.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed in a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed in a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed in a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed in a single layer or a multilayer of a film made of an organic substance. The organic substance may include a general-purpose polymer such as polymethyl methacrylate (PMMA) and polystyrene (PS); a polymer derivative having phenols; polyacrylates; polyimides; poly(aryl ethers); polyamides; fluoropolymers; poly-p-xylenes; and polyvinyl alcohols; and a combination thereof. In addition, the planarization layer 317 may be formed as a multi-stack including an inorganic insulating layer and an organic insulating layer.

An anisotropic conductive anodic oxide film 200 is provided on the circuit board 300 constructed as described above. The anisotropic conductive anodic oxide film 200 is provided between the micro LEDs 100 and the circuit board 300 to electrically connect the circuit board 300 and the micro LED 100.

The anodic oxide film 200 is a film formed by anodizing a metal that is a base material, and pores are formed in a process of forming the anodic oxide film 200 by anodizing the metal. For example, in a case that the base metal is aluminum (Al) or an aluminum alloy, the anodization of the base material forms the anodic oxide film 200 consisting of anodized aluminum ($Al_2O_3$) on a surface of the base material. As described above, the anodic oxide film 200 is divided into a barrier layer in which pores 201 are not formed and a porous layer in which pores 201 are formed. The barrier layer is positioned on top of the base material and the porous layer is positioned on top of the barrier layer. After removing the base material on which the anodic oxide film 200 having the barrier layer and the porous layer is formed, only anodic oxide film 200 consisting of anodized aluminum ($Al_2O_3$) remains. In addition, after removing the barrier layer, the anodic oxide film 200 has the pores 201 extending from top to bottom longitudinally and having a regular arrangement with a uniform diameter. An internal width of the pores 201 has a size of several nm to several hundred nm.

Since each of the pores 201 is independently formed, when a conductive material 250 is filled in each of the pores 201, the conductive material 250 filled in each of the pores 201 is not connected to adjacent one and provided independently. In other words, since the pores 201 of the anodic oxide film 200 are vertically formed and spaced apart from each other, the conductive material 250 filled in the pores 201 is also vertically formed and spaced apart from adjacent one.

As described above, the conductive material 250 is filled in the pores 201 of the anodic oxide film 200 such that the anisotropic conductive anodic oxide film 200 is formed, which is conductive in the vertical direction and nonconductive in the horizontal direction. Hereinafter, the anodic oxide film in which the conductive material 250 is filled in at least one pore 201 of the anodic oxide film 200 is referred to as the anisotropic conductive anodic oxide film 200. Here, a material of the conductive material 250 is not limited, provided that the material is conductive.

As illustrated in FIG. 2, the conductive material 250 may be filled in all of the pores 201 of the anisotropic conductive anodic oxide film 200. The anisotropic conduction anodic oxide film 200 may be divided into a region where the micro LEDs 100 are mounted and a region where the micro LEDs 100 are not mounted. As illustrated in FIG. 2, the entirety of the multiple pores 201 may be filled with the conductive material 250, including the area where the micro LEDs 100 are not mounted.

As the conductive material 250 is filled in the pores 210 of the region where the micro LEDs 100 are mounted, the region where the micro LEDs 100 are mounted has conductivity in the vertical direction through the conductive material 250 such that heat generated in the micro LEDs 100 can be effectively dissipated in the vertical direction through the conductive material 250.

Due to the configuration of the anisotropic conductive anodic oxide film 200 having the material properties of the anodic oxide film, it is possible to effectively dissipate the heat generated in the micro LEDs 100 in the vertical direction and effectively prevent the heat generated in the micro LEDs 100 from being transferred in the horizontal direction. As a result, it is possible to minimize the influence of the heat generated in the micro LED 100 on adjacent micro LEDs 100, thereby preventing the luminous efficacy of the micro LEDs 100 from being lowered.

In addition, as the conductive material 250 is filled in the pores 201 in the region where the micro LEDs 100 are not Mounted, there is an advantage in that a precise alignment technique in forming a metal pad 270, which will be described later, is not required to be considered.

The metal pad 270 is provided on the anisotropic conductive anodic oxide film 200. Specifically, the metal pad 270 is provided on the anisotropic conductive anodic oxide film 200 corresponding to each mounting position of the micro LED 100. The metal pad 270 is electrically connected to the first contact electrode 106 of the micro LED 100. The metal pad 270 may have various shapes, for example, may be patterned in an island layout. The micro LED 100 is mounted on the metal pad 270.

The first contact electrode 106 of the micro LED 100 is electrically connected to the metal pad 270, and the metal pad 270 is electrically connected to the drain electrode 330*b* through the conductive material of the anisotropic conductive anodic oxide film 200 and a contact hole of the circuit board 300.

A first electrode (not illustrated) may be provided on the circuit board 300. The first electrode (not illustrated) is electrically connected to the drain electrode 330*b* through the contact hole 350 provided on the planarization layer 317 and electrically connected to the metal pad 270 through the anisotropic conductive anodic oxide film 200. The first electrode (not illustrated) may have various shapes, for example, may be patterned in an island layout.

A lower metal pad (not illustrated) may be further provided under the anisotropic conductive anodic oxide film 200. A material of the lower metal pad not limited, provided that the material is conductive. The lower metal pad may have various shapes, for example, patterned in an island layout. The lower metal pad functions to more effectively electrically connect the anisotropic conductive anodic oxide film 200 and the drain electrode 330*b*.

The upper electrode 290 is provided on the micro LED 100. The upper electrode 290 is electrically connected to the second contact electrode 107 of the micro LED 100. The upper electrode 290 may be formed of a transparent conductive material such as ITO, IZO, ZnO, and $In_2O_3$.

Hereinafter, a method of manufacturing the micro LED structure according to the first embodiment of the present invention will be described. The method includes: a first step in which the conductive material 250 is filled in the entire pores 201 of the anodic oxide film 200 formed by anodizing the metal to prepare the anisotropic conductive anodic oxide film 200; a second step in which the metal pad 270 is provided on the anisotropic conductive anodic oxide film 200; and a third step in which the micro LED 100 is mounted on the metal pad 270.

Figure 3A:
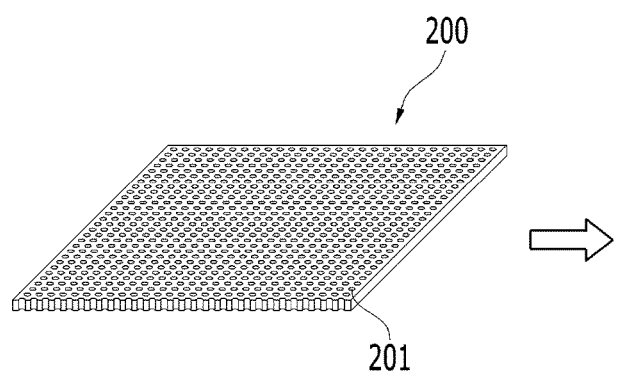
FIGS. 3A to 3D are views illustrating a method of manufacturing the micro LED structure according to the first embodiment of the present invention.
Figure 3B:
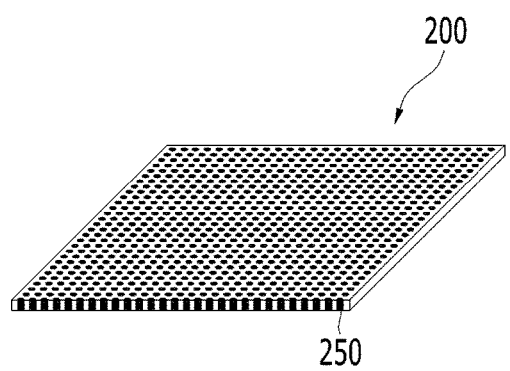
Figure 3D:
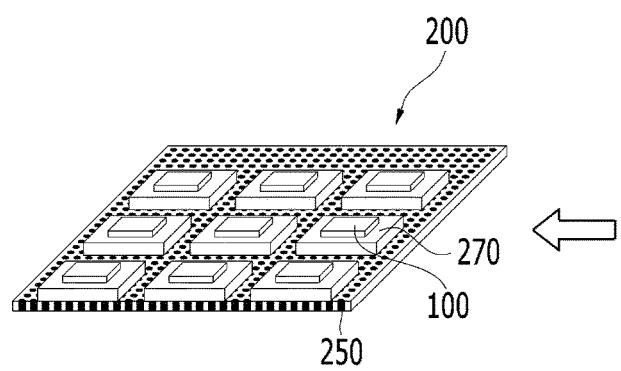
Figure 3C:
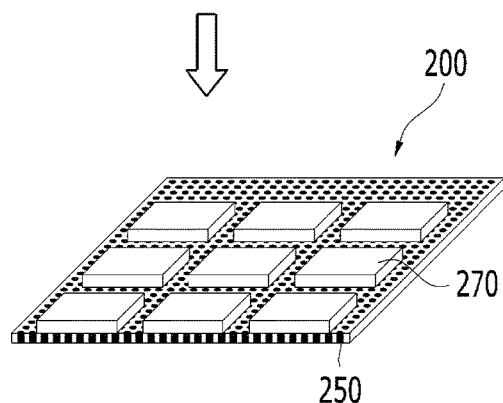

Preparing of the anisotropic conductive anodic oxide film 200 will be described. The anodic oxide film 200 is prepared by anodizing the metal, which is the base material. Then, the metal base is removed and the barrier layer of the anodic oxide film 200 is removed such that the pores 201 are configured to extend from top to bottom as illustrated in FIG. 3A. Then, as illustrated in FIG. 3B, the conductive material 250 is filled in the pores 201 extending from top to bottom. To fill the pores 201 with the conductive material 250, an atomic layer deposition (ALD) method may be used. Any filling method other than ALD may be used, provided that the conductive material 250 is filled in the pores 201 by performing the filling method. As the conductive material 250 is formed along a direction in which the pores 201 are formed, the anodic oxide film 200 becomes the anisotropic conductive anodic oxide film 200.

Thereafter, the metal pad 270 is provided on at least one surface of the anisotropic conductive anodic oxide film 200. Each metal pad 270 is patterned and disposed spaced apart from each other. The metal pad 270 provided on an upper surface of the anisotropic conductive anodic oxide film 200 is electrically connected to the first contact electrode 106 of the micro LED 100, and the metal pad 270 provided on a lower surface of the anisotropic conductive anodic oxide film 200 is electrically connected to the contact hole 350 of the circuit board 300.

Thereafter, the micro LED 100 is transferred to the upper surface of the metal pad 270 for mounting. Then, the upper electrode 290 is provided on an upper surface of the micro LED 100. Here, the upper electrode 290 may be provided individually for each micro LED 100, or one upper electrode 290 may be provided on the upper surface of the multiple micro LEDs 100 as illustrated in FIG. 2. Then, the configuration is disposed on top of the circuit board 300 to complete the micro LED structure.

However, before mounting the micro LED 100 on the metal pad 270, the anisotropic conductive anodic oxide film 200 having the metal pad 270 is mounted on the circuit board 300. In other words, after the anisotropic conductive anodic oxide film 200 having the metal pad 270 is provided on the circuit board 300, the micro LED 100 is mounted, and then the upper electrode 290 is provided, whereby the micro LED structure is obtained.

In the case of manufacturing the micro LED structure using the anisotropic conductive anodic oxide film 200 as described above, an additional equipment or process for thermocompression bonding is not required. In addition, it is possible to electrically connect the circuit board 300 and the micro LED 100 more effectively through the conductive material 250 that is provided inside the pores 201 of the anodic oxide film 200, spaced at regular intervals, and has a uniform length. Furthermore, in the case of manufacturing the micro LED structure according to the first embodiment, since the conductive material 250 is filled in the entire pores 201 of the anodic oxide film 200, it is possible to manufacture the patterned metal pad 270 more easily.

Second Embodiment

Hereinafter, a second embodiment of the present invention will be described. It should be noted that the embodiment described below will be described with particular emphasis on characteristic components as compared with the first embodiment, and descriptions of the same or similar components as those of the first embodiment will be omitted.

Figure 4:
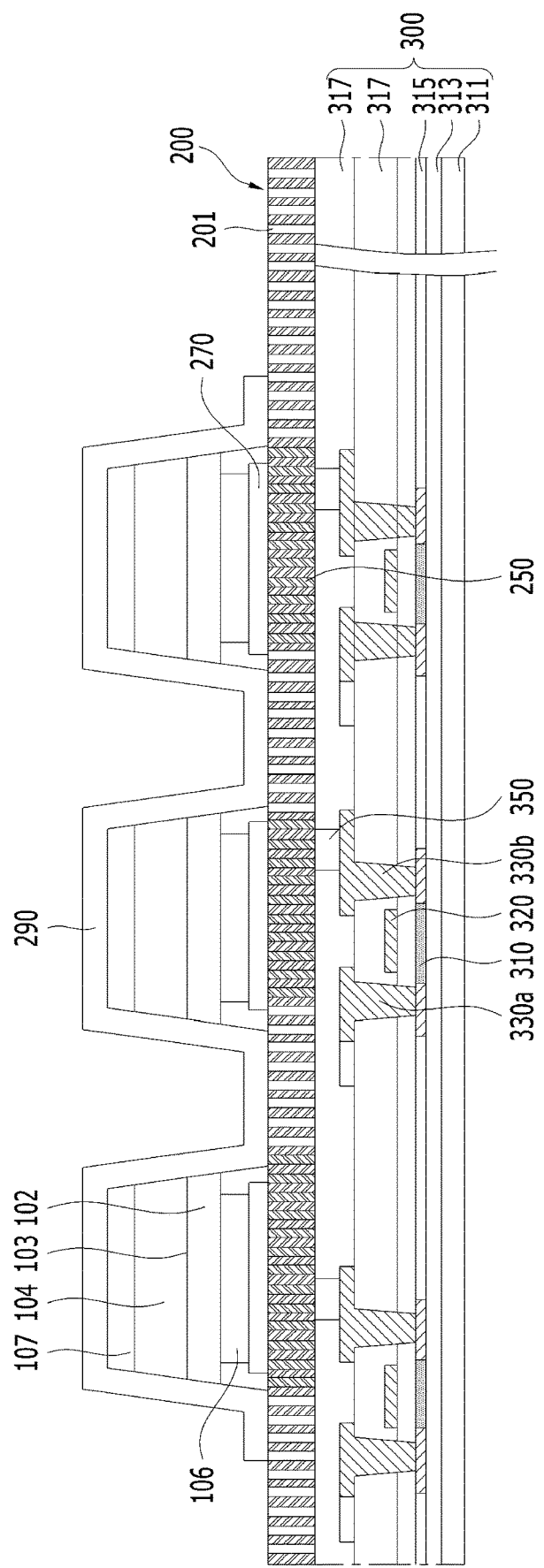
FIG. 4 is a cross-sectional view illustrating a micro LED structure according to a second embodiment of the present invention.

FIG. 4 is a cross-sectional view illustrating a micro LED structure according to the second embodiment of the present invention. The micro LED structure according to the second embodiment of the present invention is different from the first embodiment in a region where the conductive material 250 is filled. In the first embodiment, the entire pores 201 of the anodic oxide film 200 are filled with the conductive material 250. However, in the second embodiment, the conductive material 250 is filled only in the pores 201 of a region corresponding to the region where the metal pad 270 is provided. Here, the region corresponding to the region where the metal pad 270 is provided may have the same area as that of the metal pad 270 or may have a size that does not contact an adjacent metal pad 270.

Due to the difference in configurations, the micro LED structure according to the second embodiment can reduce the amount of the conductive material 250 used compared to the first embodiment. In addition, it is possible to prevent an electrical short-circuit that may occur due to an overflow of the conductive material 250 filled in the pores 201 of the region where the micro LED 100 is not mounted.

Hereinafter, a method of manufacturing the micro LED structure according to the second embodiment of the present invention will be described. The method includes: a first step in which the conductive material 250 is filled in a part of the pores 201 of the anodic oxide film 200 formed by anodizing the metal to prepare the anisotropic conductive anodic oxide film 200; a second step in which the metal pad 270 is provided on the anisotropic conductive anodic oxide film 200; and a third step in which the micro LED 100 is mounted on the metal pad 270.

Figure 5A:
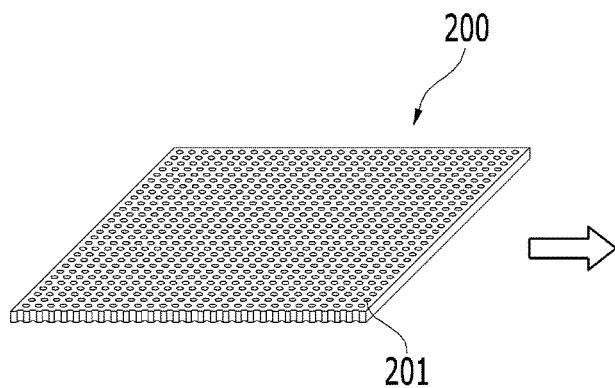
FIGS. 5A to 5D are views illustrating a method of manufacturing the micro LED structure according to the second embodiment of the present invention.
Figure 5B:
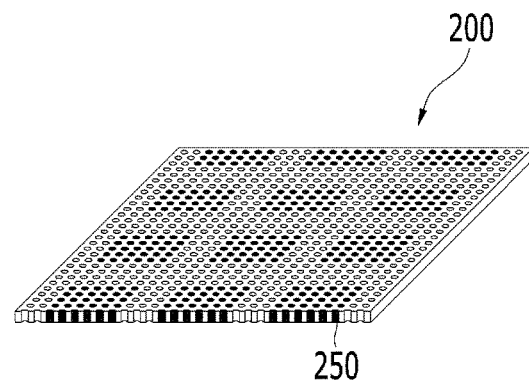
Figure 5D:
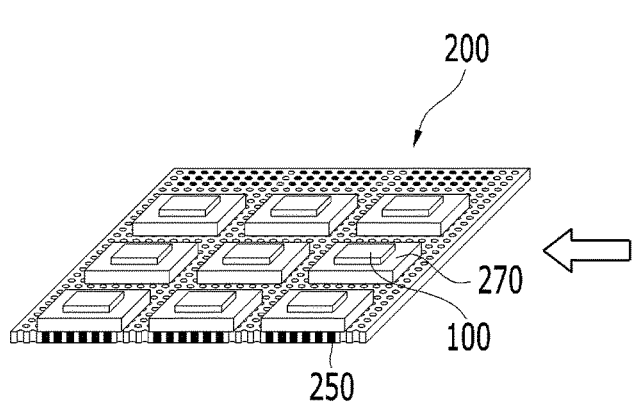
Figure 5C:
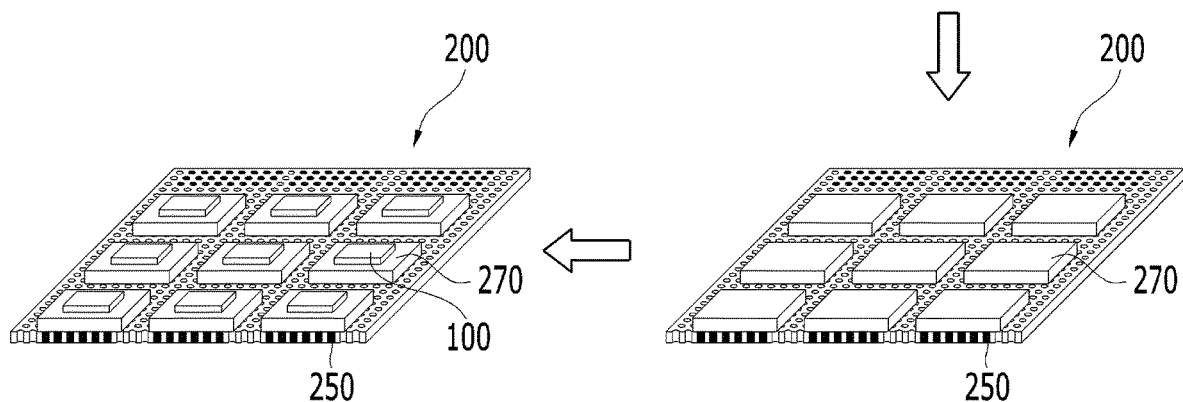

Preparing of the anisotropic conductive anodic oxide film 200 will be described. The anodic oxide film 200 is prepared by anodizing the metal, which is the base material. Then, the metal base is removed and the barrier layer of the anodic oxide film 200 is removed such that the pores 201 are configured to extend from top to bottom as illustrated in FIG. 5A. Then, as illustrated in FIG. 5B, the conductive material 250 is filled in the a part of the pores 201, which extends from top to bottom, within a region where the metal pad 270 is to be provided. Here, the conductive material 250 may be filled in the pores 201 by performing ALD. Any filling method other than ALD may be used, Provided that the conductive material 250 is filled in the pores 201 by performing the filling method. As the conductive material 250 is formed along a direction in which the pores 201 are formed, the anodic oxide film 200 becomes the anisotropic conductive anodic oxide film 200.

Thereafter, the metal pad 270 is provided on at least one surface of the anisotropic conductive anodic oxide film 200. The metal pad 270 is provided on a region corresponding to region filled with the conductive material 250 in the pores 201. Each metal pad 270 is patterned and disposed spaced apart from each other. The metal pad 270 provided on an upper surface of the anisotropic conductive anodic oxide film 200 is electrically connected to the first contact electrode 106 of the micro LED 100, and the metal pad 270 provided on a lower surface of the anisotropic conductive anodic oxide film 200 is electrically connected to the contact hole 350 of the circuit board 300.

Thereafter, the micro LED 100 is transferred to the upper surface of the metal pad 270 for mounting. Then, the upper electrode 290 is provided on an upper surface of the micro LED 100. Here, the upper electrode 290 may be provided individually for each micro LED 100, or one upper electrode 290 may be provided on the upper surface of the multiple micro LEDs 100 as illustrated in FIG. 4. Then, the configuration is disposed on top of the circuit board 300 to complete the micro LED structure.

However, before mounting the micro LED 100 on the metal pad 270, the anisotropic conductive anodic oxide film 200 having the metal pad 270 is mounted on the circuit board 300. In other words, after the anisotropic conductive anodic oxide film 200 having the metal pad 270 is provided on the circuit board 300, the micro LED 100 is mounted, and then the upper electrode 290 is provided.

In the case of manufacturing the micro LED structure using the anisotropic conductive anodic oxide film 200 as described above, an additional equipment or process for thermocompression bonding is not required. In addition, it is possible to electrically connect the circuit board 300 and the micro LED 100 more effectively through the conductive material 250 that is provided inside the pores 201 of the anodic oxide film 200, spaced at regular intervals, and has a uniform length. Furthermore, the micro LED structure according to the second embodiment can reduce the amount of the conductive material 250 used. In addition, it is possible to prevent an electrical short-circuit that may occur due to an overflow of the conductive material 250 filled in the pores 201 of the region where the micro LED 100 is not mounted.

Third Embodiment

Hereinafter, a third embodiment of the present invention will be described. It should be noted that the embodiment described below will be described with particular emphasis on characteristic components as compared with the first embodiment, and descriptions of the same or similar components as those of the first embodiment will be omitted.

Figure 6:
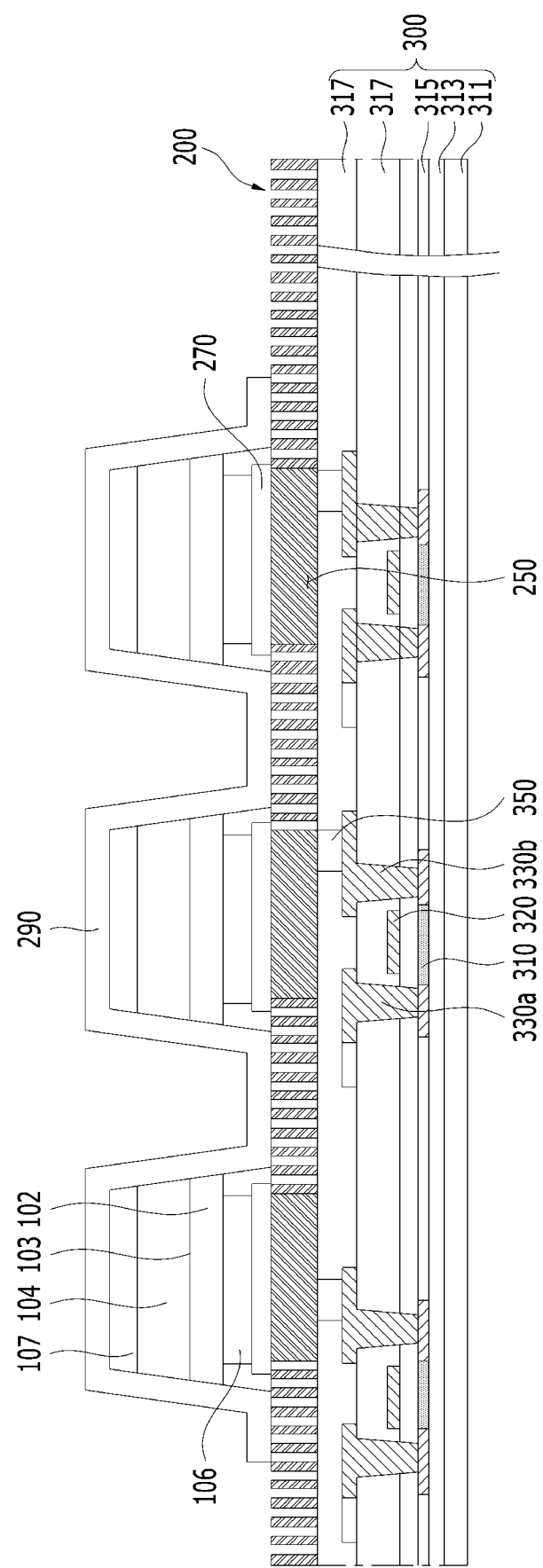
FIG. 6 is a cross-sectional view illustrating a micro LED structure according to a third embodiment of the present invention.

FIG. 6 is a cross-sectional view illustrating a micro LED structure according to the third embodiment of the present invention. The micro LED structure according to the third embodiment of the present invention differs from the first embodiment in a region where the conductive material 250 is filled. In the first embodiment, the entire pores 201 of the anodic oxide film 200 are filled with the conductive material 250. However, the third embodiment provides a through-hole 203 having an opening area larger than that of an individual pore 201, and the conductive material 250 is filled in the through-hole 203. In other words, the through-hole 203 of the third embodiment has a hole size larger than that of the pores 201 formed by anodizing the metal.

Due to the difference in configurations, the micro LED structure according to the third embodiment is more advantageous with respect to the heat dissipation compared to the first embodiment. In addition, it is possible to prevent an electrical short-circuit that may occur due to an overflow of the conductive material 250 filled in the pores 201 of the region where the micro LED 100 is not mounted.

Hereinafter, a method of manufacturing the micro LED structure according to the third embodiment of the present invention will be described. The method includes: a first step in which the conductive material 250 is filled in the through-hole 203 of the anodic oxide film 200 formed by anodizing the metal to prepare the anisotropic conductive anodic oxide film 200; a second step in which the metal pad 270 is provided on the anisotropic conductive anodic oxide film 200; and a third step in which the micro LED 100 is mounted on the metal pad 270.

Preparing of the anisotropic conductive anodic oxide film 200 will be described. The anodic oxide film 200 is prepared by anodizing the metal, which is the base material. Then, the Metal base is removed and the barrier layer of the anodic oxide film 200 is removed such that the pores 201 are configured to extend from top to bottom. However, unlike the first and second embodiments, the barrier layer may not be removed. In addition, the through-hole 203 is formed as illustrated in FIG. 7A. Multiple through-holes 203 are formed and configured to extend from top to bottom of the anodic oxide film 200 longitudinally. Each through-hole 203 is formed by etching the above-described anodic oxide film 200. A diameter of the through-holes 203 is configured to be larger than that of the pores. In addition, the multiple pores 201 are positioned between adjacent through-holes 203, and a distance between adjacent two pores 201 is shorter than a distance between adjacent two through-holes 203. Then, as illustrated in FIG. 7B, the conductive material 250 is filled in the through-holes 203 extending from top to bottom. A filling method is not limited as long as it is possible to fill the conductive material 250 in the through-holes 203. As the conductive material 250 is formed along a direction in which the through-holes 203 are formed, the anodic oxide film 200 becomes the anisotropic conductive anodic oxide film 200.

Thereafter, the metal pad 270 is provided on at least one surface of the anisotropic conductive anodic oxide film 200. The metal pad 270 is provided on a region corresponding to the region filled with the conductive material 250 in the through-holes 203. Each metal pad 270 is patterned and disposed spaced apart from each other. The metal pad 270 provided on an upper surface of the anisotropic conductive anodic oxide film 200 is electrically connected to the first contact electrode 106 of the micro LED 100, and the metal pad 270 provided on a lower surface of the anisotropic conductive anodic oxide film 200 is electrically connected to the contact hole 350 of the circuit board 300.

Thereafter, the micro LED 100 is transferred to the upper surface of the metal pad 270 for mounting. Then, the upper electrode 290 is provided on an upper surface of the micro LED 100. Here, the upper electrode 290 may be provided individually for each micro LED 100, or one upper electrode 290 may be provided on the upper surface of the multiple micro LEDs 100 as illustrated in FIG. 6. Then, the configuration is disposed on top of the circuit board 300 to complete the micro LED structure.

However, before mounting the micro LED 100 on the metal pad 270, the anisotropic conductive anodic oxide film 200 having the metal pad 270 is mounted on the circuit board 300. In other words, after the anisotropic conductive anodic oxide film 200 having the metal pad 270 is provided on the circuit board 300, the micro LED 100 is mounted, and then the upper electrode 290 is provided.

As described above, the present invention has been described with reference to the preferred embodiments. However, those skilled in the art will appreciate that various modifications, additions and substitutions are possible, without departing from the scope and spirit of the invention as disclosed in the accompanying claims.

The invention claimed is:

1. An electrical structure comprising:
an anisotropic conductive anodic oxide film,
wherein the anisotropic conductive anodic oxide film includes pores, the pores including first pores and second pores, the pores being formed by anodizing a metal,
wherein the first pores are filled with a conductive material,
wherein the anisotropic conductive anodic oxide film is provided between a first device and a second device to electrically connect the first device and the second device, by the conductive material in the first pores,
wherein the first pores are located in a first region where the first device is provided, the first pores being filled with the conductive material to electrically connect the first device and the second device, and
wherein the second pores are located in a second region where the first device is not provided, the second pores not being filled with the conductive material.

2. An electrical structure comprising:
an anisotropic conductive anodic oxide film,
wherein the anisotropic conductive anodic oxide film includes pores formed by anodizing a metal and a through-hole having a hole size larger than that of each of the pores,
wherein the through-hole is filled with a conductive material,
wherein the through-hole is formed by etching an anodic oxide film,
wherein the anisotropic conductive anodic oxide film is provided between a first device and a second device to electrically connect the first device and the second device, by the conductive material in the through-hole,
wherein the through-hole is located in a first region where the first device is provided, the through-hole being filled with the conductive material to electrically connect the first device and the second device, and
wherein the pores are located in a second region where the first device is not provided, the pores in the second region not being filled with the conductive material.

* * * * *